US009325289B2

(12) United States Patent
Curutchet

(10) Patent No.: US 9,325,289 B2
(45) Date of Patent: Apr. 26, 2016

(54) COAXIAL-IMPEDANCE SYNTHESIZER

(76) Inventor: Arnaud Curutchet, Merignac (FR)

(*) Notice: Subject to any disclaimer, the term of this patent is extended or adjusted under 35 U.S.C. 154(b) by 246 days.

(21) Appl. No.: 14/005,539

(22) PCT Filed: Mar. 19, 2012

(86) PCT No.: PCT/EP2012/054845
§ 371 (c)(1),
(2), (4) Date: Mar. 24, 2014

(87) PCT Pub. No.: WO2012/126900
PCT Pub. Date: Sep. 27, 2012

(65) Prior Publication Data
US 2014/0191820 A1    Jul. 10, 2014

(30) Foreign Application Priority Data

Mar. 18, 2011  (FR) ...................... 11 52236

(51) Int. Cl.
*H03H 7/38* (2006.01)
*H01P 5/04* (2006.01)
*H03H 7/40* (2006.01)

(52) U.S. Cl.
CPC .. *H03H 7/38* (2013.01); *H01P 5/04* (2013.01); *H03H 7/40* (2013.01)

(58) Field of Classification Search
CPC ................................. H03H 7/38; H03H 7/40
USPC ......................... 333/263, 17.3, 33
See application file for complete search history.

(56) References Cited

U.S. PATENT DOCUMENTS

| 3,792,385 A | 2/1974 | Napoli et al. |
| 6,674,293 B1 | 1/2004 | Tsironis |
| 2009/0146757 A1 | 6/2009 | Vellas et al. |

FOREIGN PATENT DOCUMENTS

| EP | 0899809 | 3/1999 |
| JP | 06177614 | 6/1994 |
| JP | 2004007056 | 1/2004 |
| WO | 2007010134 | 1/2007 |

OTHER PUBLICATIONS

International Search Report, filed on Mar. 19, 2012, for PCT application PCT/EP2012/054845. Date of mailing: Jun. 1, 2012.
Written Opinion, filed on Mar. 19, 2012, for PCT application PCT/EP2012/054845. Date of mailing: Jun. 1, 2012.

*Primary Examiner* — Stephen E Jones
(74) *Attorney, Agent, or Firm* — Steinfl & Bruno LLP

(57) ABSTRACT

The invention relates to a coaxial-impedance synthesizer, comprising: a longitudinal central (0x) conductor (1); an outer conductive tube (2) arranged coaxially to the conductor (1); and at least one probe (4) mounted so as to longitudinally translate around the conductor (1), the coaxial-impedance synthesizer being characterized in that the outer tube (2) includes two separable half-tubes, such that the probe (4) is permitted to move longitudinally, relative to the central conductor (1), to a desired position when the two half-tubes are spaced apart from each other, and when the two half-tubes are near each other, the outer periphery of the probe (4) and the inner wall of the outer tube are in contact with each other.

10 Claims, 6 Drawing Sheets

FIG. 1  *Prior Art*
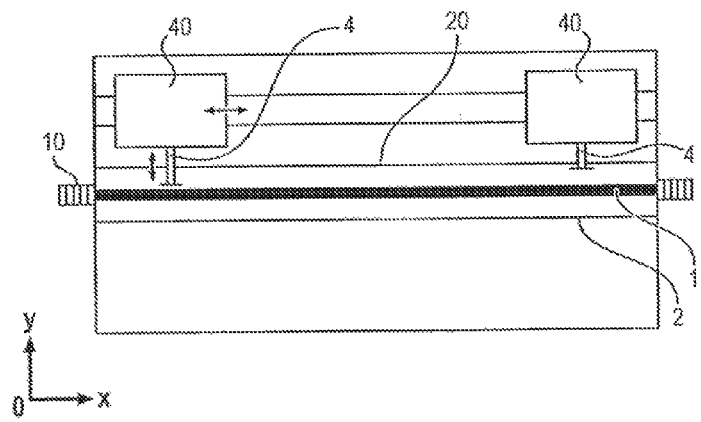
FIG. 2  *Prior Art*
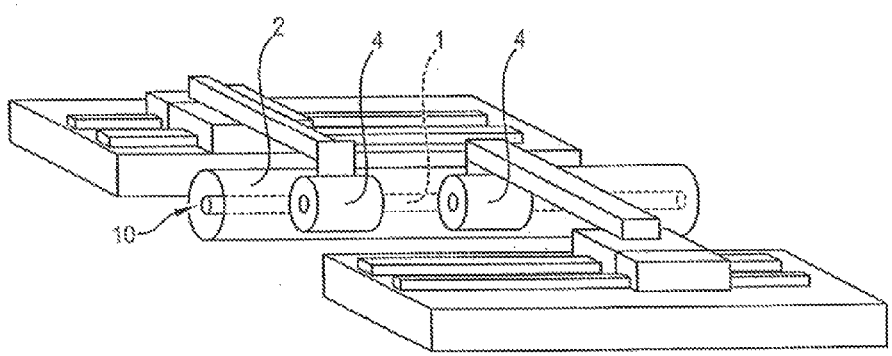

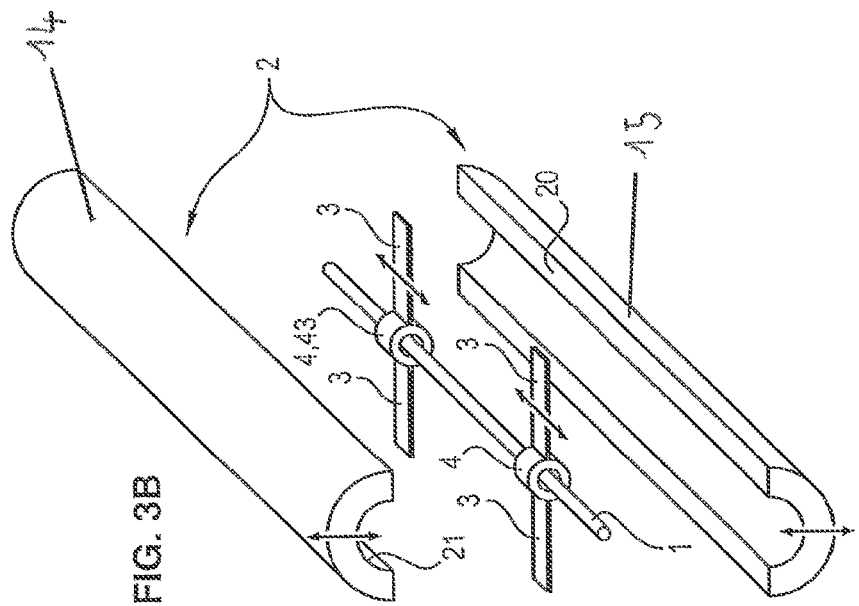
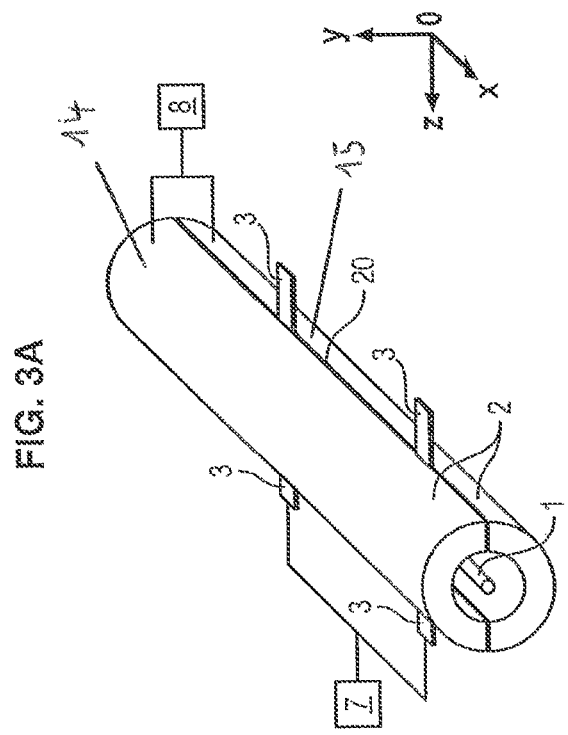
FIG. 3A
FIG. 3B

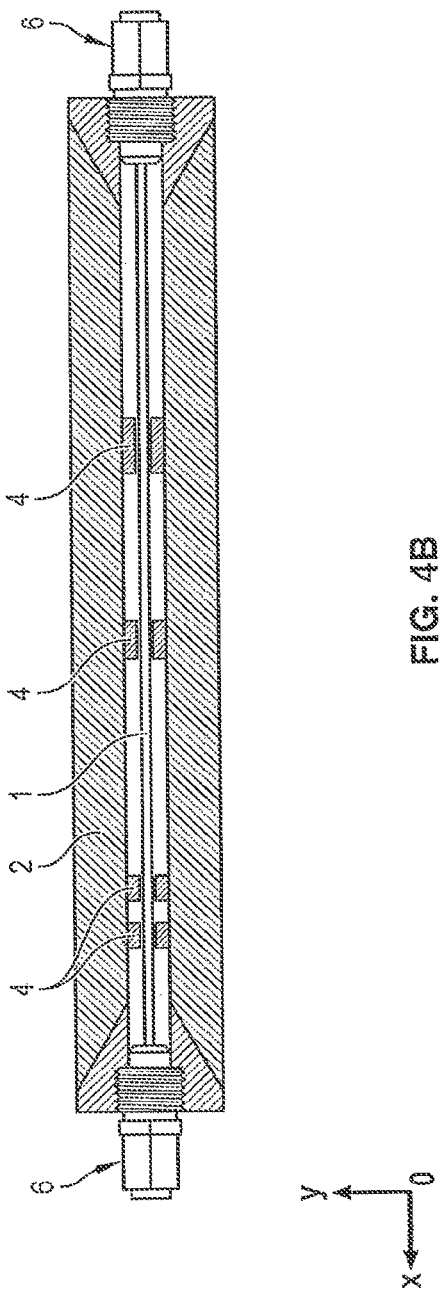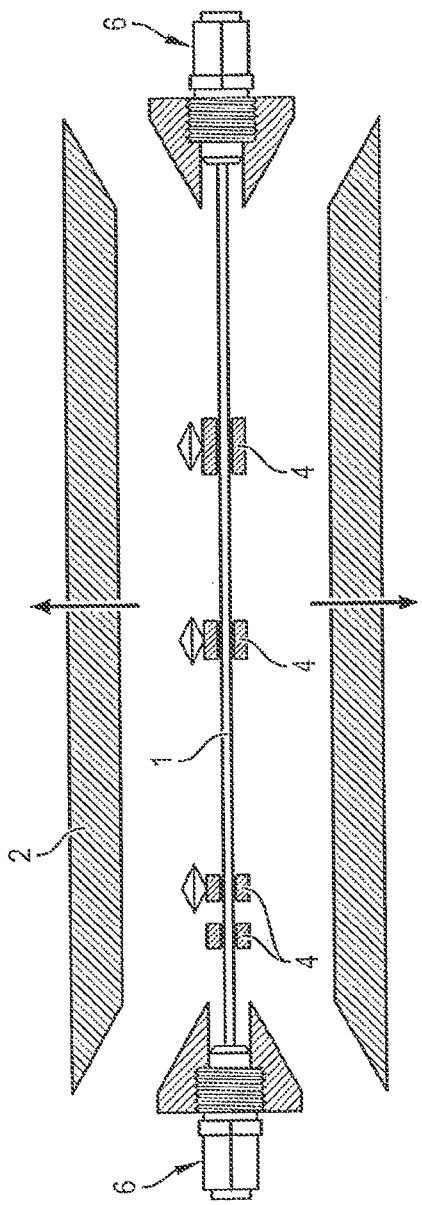

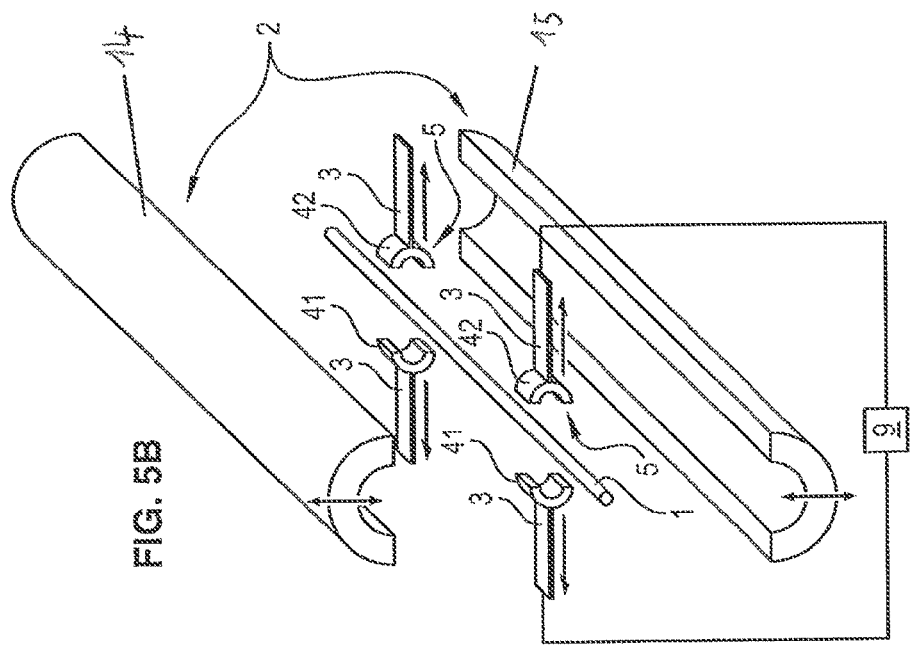
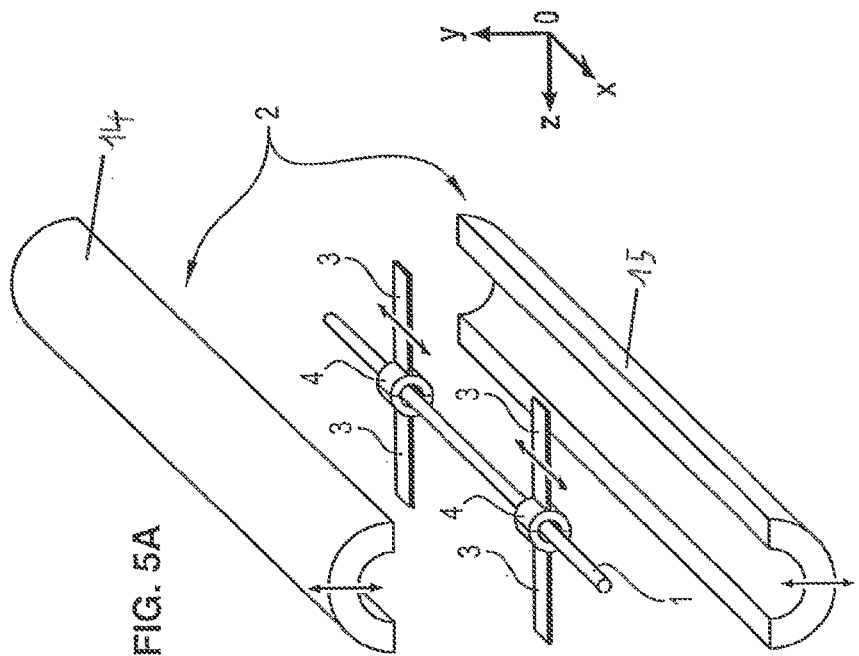

COAXIAL-IMPEDANCE SYNTHESIZER

GENERAL TECHNICAL FIELD

The present invention relates to the field of microwave electronics, for example for measurement instruments.

PRESENTATION OF THE PRIOR ART

As shown in FIG. 1, impedance adapters (also known as 'tuners' by those skilled in the art) are known, which comprise a coaxial conductor, the outer part 2 of which is cut by a slit 20 in the direction of its length, indicated by axis Ox. This slit 20 allows the passage of one or more plunger-type probes 4 that can be displaced independently from each other not only along the axis Ox, but also along the axis Oy orthogonal to Ox. By changing the distance separating each plunger 4 from a central conductor 1 of the coaxial conductor 1, the characteristic impedance of the corresponding line end 10 is changed. When the plunger(s) 4 is/are maximally remote from the central conductor 1, the tuner shows an impedance of 50Ω.

There also exists mobile carriages 40 equipped in automatic versions with motors ensuring the displacement of the plungers 4 along the Oy axis and along the Ox axis.

The plunger-type tuners type can be easily calibrated. The input and the output are connected to a vector network analyzer (VNA), and for several hundreds of positions of the plunger(s) 4 along the axis Ox, or along the Oy axis between the plunger(s) 4 and the central conductor 1, the synthesized impedances are recorded.

When it is desired to use the tuner for power- or noise-characterization of electronic components, the tuner is thus controlled for showing such or such impedance via a tuner control software, which ideally also controls the VNA. It is understood that the repeatability of the tuner is a key factor for characterization.

The tuner according to FIG. 1 has disadvantages.

The microwave performance is indeed reduced by the effect of insertion loss of the tuner, linked to the transition between the coaxial connector and the center conductor 1. If the impedances are represented on a Smith chart, 'dead zones' are then observed on the chart edge because of these insertion losses.

Moreover, such plungers 4 may cause load leaks.

Further, tuners with plungers 4 are made with decks (not shown in the figures) that move along the axis Ox, through the use of stepper motors. Each deck further supports a motor for carrying out the displacement of the plungers along the axis Oy.

It is therefore understood that these decks have inertia. The velocity of movement of the decks is adversely affected, which has the effect of increasing the time required to synthesize impedances that require a displacement of the decks.

Due to this design, vibration may occur at the diver(s), which can alter the performance of the tuner. The vibrations generated by the tuner can also cause degradation of the contacts of the components measured on-wafer.

Furthermore, this mode of conception leads to bulky and relatively heavy tuners, which penalizes their use for measurements on probing tip station for on-wafer characterization. Due to their bulkiness, it is impossible to place these tuners very close to the components measured, which inevitably increases the insertion loss and therefore 'dead zones' on the Smith chart.

Pre-adaptation systems may be optionally connected between the microwave tips and the tuner to overcome this problem.

However, these systems are particularly rigid, which increases the problems of vibration at the tip ends and of degradation of the components contacts. In extreme cases, this can cause the destruction of the measured component, or of the microwave tips.

Finally, the most stringent problem of the plunger-type tuners is their reliability. Indeed, the movement of the plungers along the axis Oy must be particularly accurate, with accuracies of the order of magnitude of the micrometer. When the tuner is to be displaced for mounting it on a measurement bench or dismounting it, a small shock may be sufficient to deteriorate the servo mechanism of the plungers along the axis Oy. If in use a plunger 4 comes to hit the central conductor 1 of the coaxial connector, the tuner is out of order.

As shown in FIG. 2, there is also known a coaxial tuner with double-probe 4 (also known as receiver 'dual slug' tuner) which theoretically allows to best characterize power and noise of transistors.

This tuner is designed to operate in wide frequency ranges: it can operate in frequencies ranging from 0.25 to 250 GHz. The two probes 4 are only capable of a translational movement along a coaxial conductor 1 graduated along the axis Ox.

The electromagnetic principle involves moving two line ends 4 having characteristic impedances different from 50Ω. These line ends 4 are made with the probes 4.

In operation, 1. a first probe 4, so-called preadaptation probe, moves over a distance $\lambda/2$, where $\lambda$ is the wavelength for a given signal frequency, and 2. a second probe 4 is moved over a distance $\lambda/2$ relative to the first probe 4.

The tuner according to FIG. 2 has drawbacks.

The tuner is designed to operate only at the fundamental frequency, i.e. one can not work on the different harmonics, which would require using a larger number of probes.

The tuner has many limitations, and the electromagnetic performance is not optimal.

In order to allow the displacement of the probes 4, it is indeed necessary to perform a sliding-type adjustment between the outer diameter of the probes 4 and the inner diameter of the outer conductor 2. Apart from the fact that the displacement of the probes 4 generates unavoidable wearing by friction, this play makes the electrical contact between the outside of the proves 4 and the inside of the tube 2 forming the outer conductor of the coaxial conductor poor and inhomogeneous. The coaxiality between the probes 4 and the coaxial conductor is not completely controlled, and a difference of a few tenths of a degree is sufficient to significantly shift the practical results from the theoretical results. This problem inevitably leads to problems of repeatability, making the use of the tuner impossible for characterizating an electronic component.

Moreover, if the probes 4 take slightly askew positions, this can cause a destruction of the mechanism if one of the probes 4 gets caught on any asperity present inside the outer conductor 2.

Another major flaw of the tuner according to FIG. 2 is the impossibility to obtain an impedance of 50Ω in use, since it would require to remove the probes 4. This is possible but requires removal of the connectors, and thus the disassembling of the instrument from the measurement bench to which it belongs.

In addition, changing the probes 4 is not easy, since it requires that they exit at one of the ends of the coaxial conductor, requiring a systematic disassembly of the microwave connectors. However, the performance of the latter is not guaranteed beyond a certain number of assembling/disassembling operations.

The use of any lubrication means remains excluded due to the electromagnetic problems that it would generate.

SUMMARY OF THE INVENTION

The invention aims at overcoming at least one of the disadvantages of the prior art.

To this end, the invention provides a coaxial impedance synthesizer, comprising:
  a central longitudinal conductor,
  an outer conductive tube coaxial with the conductor,
  at least one probe mounted around the conductor in longitudinal translation,
the coaxial impedance synthesizer being characterized in that:
  the outer tube comprises two separable half-tubes, so that:
    the probe is allowed to move longitudinally relative to the central conductor to a desired position when the two half-tubes are in a position away from each other, and
    when the two tubes are in a position of mutual proximity, the outer periphery of the probe and the inner wall of the outer tube are in contact.

The invention is advantageously completed by the following features, taken individually or in any of their technically possible combinations:
  the probe comprises two fastening legs each located in a space separating the two half-tubes;
  the two half-tubes are separable, by translation along an axis (Oz) perpendicular to the central longitudinal conductor, or by rotation about an axis perpendicular to the central longitudinal conductor, or by rotation around an axis parallel to the central longitudinal conductor;
  the impedance synthesizer includes an actuator for the mutual displacement of the two half-tubes;
  the probe has at least two parts, releasably fixed to each other, so that the probe can be removably mounted around the conductor;
  the impedance synthesizer includes an actuator for the two parts;
  the impedance synthesizer includes an actuator acting at the fastening leg;
  when the two half-tubes are in a position of mutual proximity, the outer periphery of the probe and the inner wall of the outer tube are in contact along the entire periphery of the probe;
  the impedance synthesizer includes a plurality of probes.
  the impedance synthesizer includes a group of at least two probes sharing at least one common fastening leg.

The invention further provides method for synthesizing an impedance in an impedance synthesizer, comprising the steps of:
  generating a mutual spacing away of the two half-tubes,
  longitudinally moving the probe relative to the central conductor to a desired position,
  positioning the two half-tubes in a position of mutual proximity, so as to cause the outer periphery of the probe to contact the inner wall of the outer tube,
so as to provide an impedance synthesis.

The invention has many advantages.

There is a very good electrical contact between the outer periphery of the probes and the inner wall of the outer conductor of the coaxial conductor. It is in fact in this configuration, namely when there is electrical contact between the probes and the outer conductor, itself connected to ground, that the best electromagnetic performance is achieved.

The invention allows a very precise positioning of the probes, which generates a very good repeatability of the impedances synthesized for a given positioning of the probes.

There is no friction of probes on the coaxial conductor. There is very little wear of the probes or the coaxial conductor.

There is a possibility of release the probes from the coaxial conductor, so that the latter can have exhibit a constant impedance over the entire frequency range, ideally of 50Ω. To this end, each probe is advantageously made of at least two parts removable from each other, and the movable parts of the coaxial conductor must make enough space available to allow the passage of the different parts of the probes.

The microwave performance is significantly higher than all other systems of the prior art. Indeed, the present invention allows to synthesize impedances with a high reflection coefficient, i.e. it is possible to go very close to the edge of the Smith chart.

The invention makes it possible to make a range of impedance synthesizers operable in a frequency range from 100 MHz to 1 THz.

It is possible to change the probes depending on the application and performance desired by a user, preferably automatically. According to one embodiment of the invention, the probes can thus be moved and/or changed automatically.

There is little or no vibration generated during movement of the probes.

The invention provides a greater robustness and a higher reliability than other tuners of the prior art.

A tuner according to the invention has a small footprint for a given frequency range.

The invention can operate in any position.

The invention enables to pass DC voltages.

PRESENTATION OF FIGURES

Other features, aims and advantages of the invention will become apparent from the following description, which is purely illustrative and not restrictive, given in conjunction with the accompanying drawings in which:

FIG. 1, already discussed, is a diagrammatic view of a first coaxial tuner known in the prior art;

FIG. 2, also already discussed, is a diagrammatic view of a second coaxial tuner known in the prior art;

FIG. 3A is a perspective view of one of the possible embodiments of a possible impedance synthesizer according to the invention;

FIG. 3B is an exploded view of FIG. 3A;

FIG. 4A is a sectional view of one of the possible embodiments of a possible impedance synthesizer according to the invention;

FIG. 4B is an exploded view of FIG. 4A;

FIGS. 5A and 5B are an exploded perspective view of another possible embodiment of a possible impedance synthesizer according to the invention, in which the probes are removable;

In all figures, similar elements bear identical reference numerals.

DETAILED DESCRIPTION

Figure 6:
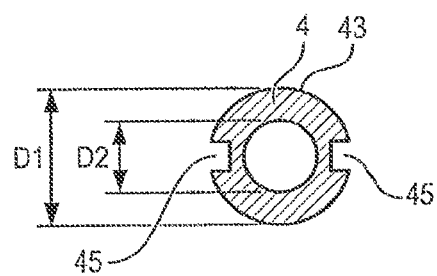
FIG. 6 is a sectional view of a cylindrical-type probe, adapted to be held by fastening legs of rectangular section.

FIGS. 3A and 3B diagrammatically show a possible embodiment of an impedance synthesizer according to the invention.

The impedance synthesizer mainly includes a central longitudinal 1 conductor extending along a longitudinal axis Ox and a conductive outer tube 2 coaxial with the conductor 1 (referred thereafter as outer tube).

The outer tube 2 comprises two separable half-tubes 14, 15.

In FIGS. 3-5, the tube is cylindrical. However, this is not mandatory and the tube may be square or rectangular. The same applies to the two half-tubes. In addition, the two half-tubes are not necessarily identical. Whatever the tube section is, it is hollow and longer than wide.

The half tubes define at least two positions: a position of away from each other, illustrated in a non-limiting manner in FIG. 3B, and a position of mutual closeness, illustrated in a non-limiting manner in FIG. 3A.

The two half-tubes are not necessarily completely separable pieces, and can may be made of one tube consisting in two half-tubes which are separated by plastic deformation of the tube.

The impedance synthesizer further comprises at least one probe 4, most preferably with a characteristic impedance different from 50Ω.

The impedance synthesizer can include only one probe, but may alternatively include a plurality of probes 4, up to a hundred for example. In FIGS. 3A and 3B, the impedance synthesizer includes two probes, and in FIGS. 4A and 4B, the impedance synthesizer includes four probes.

Each probe 4 is mounted around the central conductor 1, without contacting the central conductor 1, with a possibility of longitudinal translation.

The probe 4 is allowed to move longitudinally relative to the central conductor 1 towards a desired position when the two half-tubes are in a position away from each other. The minimum required gap between the two half-tubes in this position is that which allows the probe to move along the conductor.

When the two half-tubes are in a position of mutual proximity, the outer periphery 43 of the probe 4 and the inner wall of the outer tube 23 are in contact with each other, thereby providing an impedance synthesizer. The inner tube wall is formed by inner walls of each of the half-tubes.

In this position, the two half-tubes are in tight contact with the probe. Thus, a mechanical contact is achieved between the two half-tubes and the probe. Therefore, the probe is blocked at the desired position thanks to the two half-tubes. The contact is mechanical and also electrical if the two materials (the constituent materials of the outer periphery of the probe and the inner wall of the tube) are conductive. Even in this position, the two half-pipes are not necessarily in contact with each other and remain separated by a space 20 of longitudinal slot type. In a particular embodiment, it is possible that the two half-tubes are in contact with each other in this position: in this case, rod-type probe displacement legs may be used to move and position the probes, said legs being removed once the probes are positioned.

The impedance synthesizer is capable of operating in the frequency range from 100 MHz to THz.

Thus, when the two half-tubes are brought closer to each other, and owing to the mechanical dimensions, defects in coaxiality between the probes and the coaxial conductor are resolved: the probes are automatically centered and the mechanical—and if necessary electrical—contact between the outer periphery 43 of the probes 4 and the inner wall 21 of the tube 2 of the coaxial conductor is uniform and of good quality.

Advantageously, when the two half-tubes are in a position of mutual proximity, the outer periphery of the probe and the inner wall of the outer tube coaxial with the conductor are in contact with each other over the entire periphery of the probe.

When a user wishes to move at least one probe 4, and perform impedance synthesis, the following steps are implemented, consisting in:

causing a mutual spacing of the two half-tubes. In the embodiment illustrated in FIGS. 3-5, the two half-tubes are away from one another.

moving the probe 4 longitudinally relative to the central conductor 1 to reach a desired position, placing the two half-tubes in a position of mutual proximity, so as to bring into contact the outer periphery of the probe with the inner wall of the outer tube.

This probe preferably has a characteristic impedance different from 50Ω.

In one embodiment, the probe 4 further comprises at least one fastening leg 3 located in a space 20 separating the two half-tubes from each other.

This space 20 takes the form of a longitudinal slot when the two half-tubes are in the position of mutual proximity. This space exists on both sides of the probe, and thus two longitudinal slots separate the two half-tubes in the position of mutual proximity.

This space is wider when the two half-tubes are in a position away from one another, as diagrammatically shown in the figures.

The leg 3 is preferably in the form of a rectangular plate, but may be of any shape with a relatively small thickness and housed in the space 20, while allowing the two half-tubes to get closer to each other.

As shown by the double dotted arrows in FIG. 3B, the leg 3 is adapted to move longitudinally within the space 20 when the two half-tubes are in a position away from each other, thereby moving the probe 4 relative to the central conductor 1. The leg leg thus allows in particular to move the probe.

When the two half-tubes are in a position of mutual proximity, the probe is blocked by the two half-tubes, which implies that the leg 3 is also locked against translation.

When the two half-tubes are in the position of mutual proximity, for which the probe is blocked, the leg may also be secured in the slot-type space 20 existing between the two half-tubes. However, this is not a requirement and depends on the relative dimensions of the leg relative to the space 20 between the two half-tubes in the position of mutual proximity.

In the preferred embodiment shown in the figures, the probe 4 comprises two fastening legs 3 each located in a space 20, but could comprise for example one single leg.

Advantageously, the two half-tubes are separated by:

translation along an axis (Oz) perpendicular to the central longitudinal conductor 1, or rotation about an axis (Oz) perpendicular to the central longitudinal conductor 1, or rotation about an axis (Ox) parallel to the central longitudinal conductor 1.

The mutual displacement of the half-tubes impedance synthesizer can be done either manually or through an actuator 8.

Thus, as shown in FIGS. 3A and 3B, the impedance synthesizer may comprise an actuator 8 for the two half-tubes.

The actuator 8 may thus comprise a servomotor, a pneumatic or electric hydraulic cylinder, or an electromagnet for example.

Similarly, the impedance synthesizer 7 may comprise an actuator acting at the fastening leg 3.

The actuator 7 may for example comprise carriages guided for instance by linear rails parallel to the Ox axis, and actuated by a motor.

Several types of motors can be us to cause the displacement of probes 4, like for example:
stepper motor associated with belts or worms,
linear motor,
piezoelectric motor, or
any type of cylinder.

For impedance synthesizer dedicated to applications in the range of 100 GHz and above, in view of the wavelength value, piezoelectric motors appear to be the most suitable since they allow obtaining displacement with an accuracy of the order of magnitude of the nanometer.

FIG. 4 shows that the impedance synthesizer also includes coaxial connectors 6 mounted at the ends and that allow connecting the coaxial synthesizer to a measurement bench, for instance for characterizing an electronic component.

FIGS. 5A and 5B show that, according to an alternative embodiment, each probe 4 may comprise at least two parts 41 and 42, removably fixed to one another, so that probe 4 may be mounted in a removable manner around the conductor 1. The dotted arrows in FIG. 5B shows that the parts 41 and 42 are detachable from each other. A user may thus at will mount a variable number of probes 4, with the coaxial conductor having no probe then having an impedance of 50Ω.

Separating the part 41 from the part 42 can be done manually, but as also shown in FIG. 5B, the impedance synthesizer may include an actuator 9 for the two parts 41 and 42, any possible type of motor.

It is understood that the actuators 7 and/or 8 and/or 9 may be merged or independent.

FIG. 6 shows that each probe 4 is preferably of the cylindrical type, and comprises at least one longitudinal groove 45, each groove 45 being adapted to receive a fastening leg 3 of complementary section.

D1 represents the outer diameter of the probe 4. D1 is selected such that the outer periphery 43 is in tight contact with the inner wall 21 of the tube 2 of the impedance synthesizer, when the two half-tubes are in a position of mutual proximity.

For example, for an operation up to 34 GHz, D1 can have a value of 3.5 mm.

The diameter D2 allows the passage of the central conductor 1 of the impedance synthesizer. It must be large enough to avoid the probe 4 getting short-circuited with the center conductor 1. D2 is critical to the microwave performance of the impedance synthesizer, and can be determined from the results of electromagnetic simulations. The central conductor 1 may optionally be covered with an insulating layer to absolutely avoid short circuits between conductor 1 and probes 4.

Figure 7:
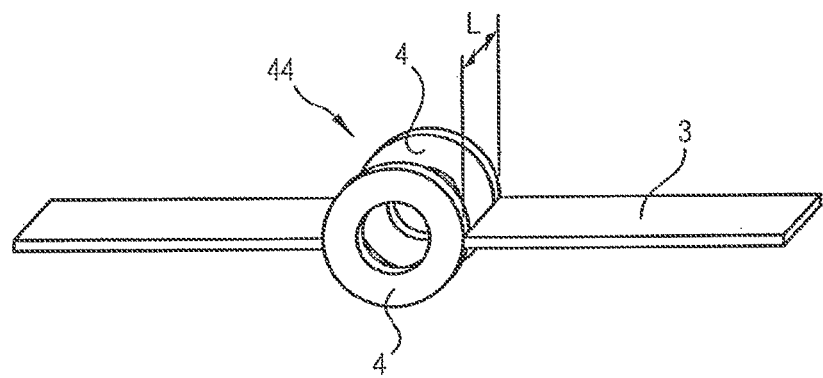
FIG. 7 shows a group of cylindrical-type probes made of two probes separated by a give distance L.

FIG. 7 shows that at least two probes 4 may be grouped together to form a group 44 sharing a common fastening leg 3 and be separated by a certain distance L determined from the results of electromagnetic simulations. This type of configuration allows reducing the operating frequency range of the group of probes 44, which allows using it as a resonator, so as to control of the impedance synthesized, not at one frequency value but at two distinct frequencies.

Generally speaking, the number of probes 4 in group 44 corresponds to the number of frequencies for which the impedance must be controlled.

The probes and the various elements constituting the impedance synthesizer can be made, in a non-limiting example, from metal or any alloy (stainless steel, brass, copper).

The overall dimensions of these elements can be validated from electromagnetic simulations.

According to an advantageous variant, the different parts can receive a thin layer of gold in order to improve the electromagnetic performance while eliminating potential corrosion problems that could degrade the long-term electromagnetic performance of the impedance synthesizer.

Figure 8:
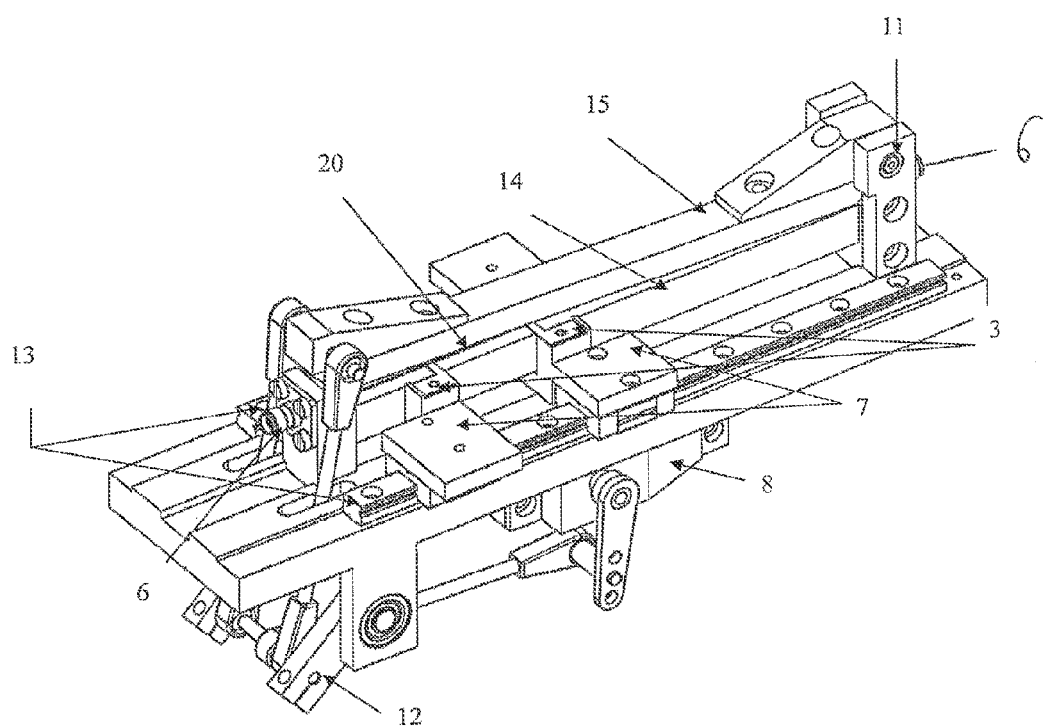
FIG. 8 shows a possible embodiment of an impedance synthesizer of the invention.

FIG. 8 shows an embodiment of an impedance synthesizer. The outer tube 2 comprises two separable half-tubes 14, 15.

One of the half-tubes is fixed, and the other half-tube is movable relative to the fixed half-tube, around a rotating hinge 11. An actuator 8 is configured to move the mobile part relative to the fixed part. The actuator 8 is itself controlled by a mechanism 12 for controlling the opening and closing of the tube 2.

The two half-pipes are separated by a space 20.

When the two half-tubes are in a position of mutual spacing, the translation of probes and legs 3 is allowed.

When the two half-tubes are in a position of mutual proximity, the outer periphery of the probe 4 and the inner wall of the outer tube are in contact with each other. The contact is a tight contact, for which the probe is locked against translation. This contact is mechanical, and electrical if the contacting materials are conductive.

The legs are moved by carriage-type actuators 7 guided by linear and parallel rails 13 and driven by a motor.

The impedance synthesizer further comprises at least one coaxial connector 6 at each of its ends.

In this exemplary embodiment, the tube has a rectangular section.

The invention claimed is:

1. A coaxial impedance synthesizer, comprising:
a central longitudinal conductor,
an outer conductive tube coaxial with the conductor,
at least one probe mounted around the conductor in longitudinal translation, wherein:
the outer tube comprises two separable half-tubes, so that:
the probe is allowed to move longitudinally relative to the central conductor to a desired position when the two half-tubes are in a position away from each other,
when the two tubes are in a position of mutual proximity, the outer periphery of the probe and the inner wall of the outer tube are in contact, and
the two half-tubes are separable, by translation along an axis perpendicular to the central longitudinal conductor, or by rotation about an axis perpendicular to the central longitudinal conductor, or by rotation around an axis parallel to the central longitudinal conductor,
the impedance synthesizer further comprising an actuator for the mutual displacement of the two half-tubes.

2. A coaxial impedance synthesizer, comprising:
a central longitudinal conductor,
an outer conductive tube coaxial with the conductor,
at least one probe mounted around the conductor in longitudinal translation, wherein:
the outer tube comprises two separable half-tubes, so that:
the probe is allowed to move longitudinally relative to the central conductor to a desired position when the two half-tubes are in a position away from each other, and when the two tubes are in a position of mutual proximity, the outer periphery of the probe and the inner wall of the outer tube are in contact, the impedance synthesizer further comprising a plurality of probes comprising a group of at least two probes sharing at least one common fastening leg.

3. A coaxial impedance synthesizer, comprising:
a central longitudinal conductor,
an outer conductive tube coaxial with the conductor,
at least one probe mounted around the conductor in longitudinal translation, wherein:
the outer tube comprises two separable half-tubes, so that:
the probe is allowed to move longitudinally relative to the central conductor to a desired position when the two half-tubes are in a position away from each other,
when the two tubes are in a position of mutual proximity, the outer periphery of the probe and the inner wall of the outer tube are in contact, and
the probe has at least two parts, releasably fixed to each other, so that the probe-can be removably mounted around the conductor.

4. An impedance synthesizer according to claim 3, including an actuator for the two parts.

5. A coaxial impedance synthesizer, comprising:
a central longitudinal conductor,
an outer conductive tube coaxial with the conductor,
at least one probe mounted around the conductor in longitudinal translation, wherein:
the outer tube comprises two separable half-tubes, so that:
the probe is allowed to move longitudinally relative to the central conductor to a desired position when the two half-tubes are in a position away from each other, and
when the two tubes are in a position of mutual proximity, the outer periphery of the probe and the inner wall of the outer tube are in contact,
wherein the probe comprises two fastening legs each located in a space separating the two half-tubes.

6. An impedance synthesizer according to claim 5, wherein the two half-tubes are separable, by translation along an axis perpendicular to the central longitudinal conductor, or by rotation about an axis perpendicular to the central longitudinal conductor, or by rotation around an axis parallel to the central longitudinal conductor.

7. An impedance synthesizer according to claim 5, including an actuator acting at the fastening leg.

8. An impedance synthesizer according to claim 5, wherein, when the two half-tubes are in a position of mutual proximity, the outer periphery of the probe and the inner wall of the outer tube are in contact along the entire periphery of the probe.

9. An impedance synthesizer according to claim 5, including a plurality of probes.

10. A method for synthesizing an impedance in an impedance synthesizer according to claim 5, comprising the steps of:
generating a mutual spacing away of the two half-tubes,
longitudinally moving the probe relative to the central conductor to a desired position,
positioning the two half-tubes in a position of mutual proximity, so as to cause the outer periphery of the probe to contact the inner wall of the outer tube, so as to provide an impedance synthesis.

* * * * *